US012701702B2

(12) United States Patent
Tang

(10) Patent No.: US 12,701,702 B2
(45) Date of Patent: Aug. 4, 2026

(54) THREE-DIMENSIONAL MEMORY DEVICE AND METHOD FOR MANUFACTURING THREE-DIMENSIONAL MEMORY DEVICE

(71) Applicant: YANGTZE MEMORY TECHNOLOGIES CO., LTD., Wuhan (CN)

(72) Inventor: Zhaohui Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 680 days.

(21) Appl. No.: 18/079,827

(22) Filed: Dec. 12, 2022

(65) Prior Publication Data

US 2023/0114522 A1 Apr. 13, 2023

Related U.S. Application Data

(63) Continuation of application No. PCT/CN2021/127009, filed on Oct. 28, 2021.

(30) Foreign Application Priority Data

Oct. 28, 2020 (CN) .......................... 202011174467.X

(51) Int. Cl.
*H10B 43/20* (2023.01)
*H10B 43/35* (2023.01)
(Continued)

(52) U.S. Cl.
CPC ............. *H10B 43/20* (2023.02); *H10B 43/35* (2023.02); *H10P 14/6328* (2026.01); *H10P 52/00* (2026.01)

(58) Field of Classification Search
CPC ........ H10B 43/20; H10B 43/35; H10B 43/10; H10B 43/27; H10B 41/35; H10B 41/27
See application file for complete search history.

(56) References Cited

U.S. PATENT DOCUMENTS

| | | | | |
|---|---|---|---|---|
| 2015/0325588 A1* | 11/2015 | Lee | ......................... | H10B 43/30 |
| | | | | 257/329 |
| 2019/0067025 A1* | 2/2019 | Yada | ......................... | G11C 8/14 |

(Continued)

FOREIGN PATENT DOCUMENTS

| | | |
|---|---|---|
| CN | 101399234 A | 4/2009 |
| CN | 106783860 A | 5/2017 |

(Continued)

OTHER PUBLICATIONS

Translation 110176461 (Year: 2019).*

(Continued)

*Primary Examiner* — Matthew C Landau
*Assistant Examiner* — Halee Cramer
(74) *Attorney, Agent, or Firm* — BAYES PLLC

(57) ABSTRACT

A three-dimensional memory device and a method for manufacturing the same are provided. The method includes steps as follows. A semiconductor structure including a substrate and a stacked structure on the substrate is provided. The stacked structure includes alternately stacked gate layers and dielectric layers, or alternately stacked dummy gate layers and dielectric layers. The dummy gate layers are replaceable by the gate layers. A groove is formed in a gate line slit region of the stacked structure. The groove penetrates through the gate layers and multiple layers of the dielectric layers, or through the dummy gate layers and multiple layers of the dielectric layers. An insulating layer is formed on a surface of the stacked structure and in the groove. A depression is formed on a surface of the insulating layer above the groove away from the substrate. The insulating layer is polished to flatten the depression.

20 Claims, 9 Drawing Sheets

(51) Int. Cl.
    *H10P 14/60*        (2026.01)
    *H10P 52/00*        (2026.01)

(56)                 References Cited

U.S. PATENT DOCUMENTS

| | | | | |
|---|---|---|---|---|
| 2019/0237475 | A1* | 8/2019 | Jung | H10D 30/694 |
| 2021/0225758 | A1* | 7/2021 | Lee | H01L 21/76895 |
| 2022/0045088 | A1* | 2/2022 | Baraskar | H10B 43/27 |

FOREIGN PATENT DOCUMENTS

| | | | | | |
|---|---|---|---|---|---|
| CN | 110176461 | A | * | 8/2019 | H10B 43/10 |
| CN | 110828470 | A | | 2/2020 | |
| CN | 111370421 | A | | 7/2020 | |
| CN | 111668228 | A | | 9/2020 | |
| CN | 111785727 | A | | 10/2020 | |
| CN | 112289798 | A | | 1/2021 | |

OTHER PUBLICATIONS

First Office action issued in corresponding Chinese Application No. 202011174467.X, mailed on May 25, 2021; 8 pages.
International Search Report issued in corresponding International Application No. PCT/CN2021/127009, mailed on Jan. 25, 2022, 6 pages.
Written Opinion issued in corresponding International Application No. PCT/CN2021/127009, mailed on Jan. 25, 2022, 4 pages.
Notice of Allowance issued in corresponding Chinese Application No. 202011174467.X, mailed on Sep. 1, 2021; 1 page.

\* cited by examiner

THREE-DIMENSIONAL MEMORY DEVICE AND METHOD FOR MANUFACTURING THREE-DIMENSIONAL MEMORY DEVICE

CROSS-REFERENCE TO RELATED APPLICATIONS

This application is a continuation of International Application No. PCT/CN2021/127009, filed on Oct. 28, 2021, which claims the benefit of priority to Chinese Application No. 202011174467.X, filed on Oct. 28, 2020, both of which are hereby incorporated by reference in their entireties.

BACKGROUND

With the development of three-dimensional (3D) NOT AND (NAND) technology, the number of layers stacked vertically in a 3D memory device is increasing. The number of layers in a high-order stacked structure keeps increasing can greatly improve the storage density and reduce the price per memory cell.

The existing memory device generally includes a number of memory blocks and a number of memory fingers located in the memory blocks. The memory blocks are separated from each other by gate line slits vertically penetrating through the stacked structure, and the memory fingers are separated from each other by gate line slits vertically penetrating through the stacked structure. The gate line slit is filled with an insulating layer for separating the gate and an array common source for extracting the source from the substrate. In order to increase the strength of the stacked structure and prevent the stacked structure from tilting or collapsing, a part of the array common source of the 3D memory device is manufactured as an H-shaped structure.

SUMMARY

The present disclosure relates mainly to the design and manufacturing field of semiconductor, and particularly to a three-dimensional memory device and a method for manufacturing a three-dimensional memory device.

A first aspect of the present disclosure provides a method for manufacturing a three-dimensional memory device including operations as follows. A semiconductor structure including a substrate and a stacked structure on the substrate is provided. The stacked structure includes alternately stacked gate layers and dielectric layers, or the stacked structure includes alternately stacked dummy gate layers and dielectric layers. The dummy gate layers can be replaced by the gate layers. A groove is formed in a gate line slit region of the stacked structure. The groove penetrates through the gate layers and multiple layers of the dielectric layers or the groove penetrates through the dummy gate layers and multiple layers of the dielectric layers. An insulating layer is formed on a surface of the stacked structure and in the groove. A depression is formed on a surface of the insulating layer above the groove away from the substrate. The insulating layer is polished to flatten the depression.

A second aspect of the present disclosure provides a three-dimensional memory device, including a substrate, a stacked structure, gate line slits, and an insulating layer. A stacked structure is arranged on the substrate and includes gate layers and dielectric layers. The gate layer and the dielectric layer are alternately stacked. The gate line slits penetrate through the stacked structure until the substrate, and are separated by a separating structure. An insulating layer is disposed on the separating structure, and the surface of the insulating layer away from the substrate is flat.

BRIEF DESCRIPTION OF THE DRAWINGS

The accompanying drawings, which are incorporated and form a part of the present disclosure, are provided for the purpose of providing a further understanding of the present disclosure, and illustrate embodiments of the present disclosure and, together with this specification, serve to explain the principles of the present disclosure.

DETAILED DESCRIPTION

Figure 1:
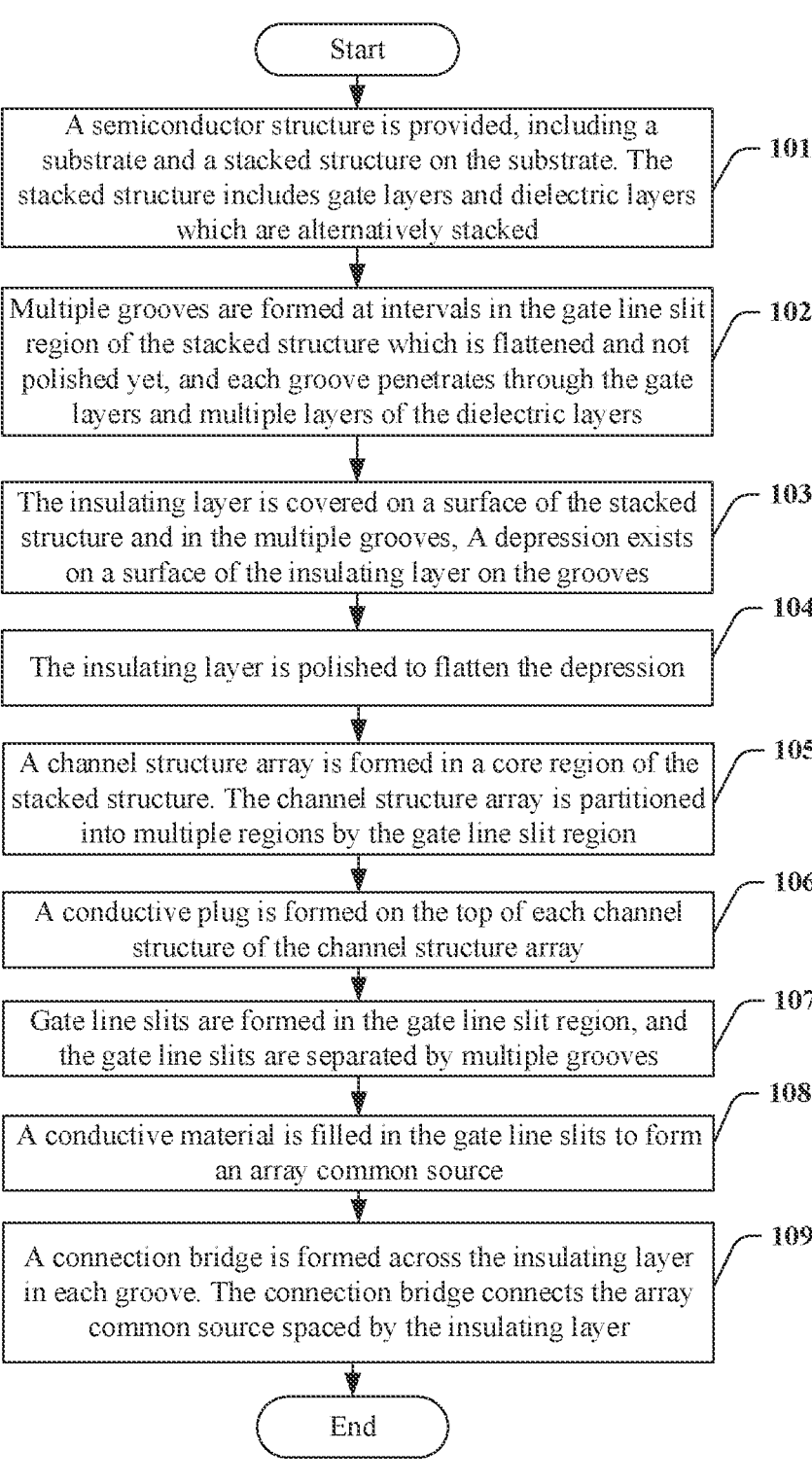
FIG. 1 is a flowchart of a method for manufacturing a three-dimensional memory device according to an embodiment of the present disclosure.

In order to more clearly illustrate the technical solutions of the embodiments of the present disclosure, the accompanying drawings are briefly described below. The accompanying drawings in the following description are merely some examples or embodiments of the present disclosure. The present disclosure may also be applied to other similar scenarios in accordance with these drawings without creative effort for those of ordinary skill in the art. The same reference numerals in the drawings represent the same structure or operation, unless otherwise specified.

As shown in the present disclosure and the claims, the words "one," "a," "an," and/or "this" do not specifically refer to singular, but may also refer to plural, unless exceptions are clearly indicated by the context. Generally speaking, the terms "include" and "comprise" only indicate that the clearly identified steps and elements are included. These steps and elements do not constitute an exclusive list, and the method or equipment may also contain other steps or elements.

Unless otherwise specified, the relative arrangement of components and steps set forth in these embodiments, numeric expressions, and numerical values do not limit the scope of the present disclosure. At the same time, it should be understood that, for ease of description, the dimensions of the various portions shown in the drawings are not drawn in an actual proportional relation. The techniques, methods, and apparatus known to those skilled in the art may not be discussed in detail, but where appropriate, the techniques, methods, and apparatus should be considered as a part of the authorized specification. In all examples shown and discussed herein, any particular value should be interpreted as merely exemplary rather than limiting. Thus, other examples may have different values. It should be noted that similar numerals and letters denote similar items in the following drawings. Therefore, once a certain numeral or letter is defined in one of the drawings, no further discussion thereof is required in the following drawings.

In the description of the present disclosure, it is to be understood that the orientation or positional relationship indicated by the orientation words such as "front, back, up, down, left, right," "inside and outside," "horizontal, vertical" and "top and bottom" is usually based on the orientation or positional relationship shown in the drawings, and is only for the convenience of describing the present disclosure and simplifying the description. In the absence of a contrary description, these orientation words do not indicate and imply that the device or the element must have a specific orientation or be constructed and operated in a specific orientation. Therefore, it cannot be understood as limiting the scope of protection of the present disclosure. The orientation words "inside and outside" refer to the inside and outside of the contour of each component itself.

For ease of description, spatial terms such as "above," "on top of," "on the upper surface," and "upper" are used to describe a spatial position relationship of a device or feature relative to other devices or features as shown in the drawings. It should be understood that spatial relative terms are intended to contain different orientations in use or operation other than the orientations described by the device in the drawings. For example, if the devices in the drawings are inverted, the devices described to be "above other devices or structures" or "on other devices or structures" are positioned to be "below other devices or structures" or "under other devices or structures". Thus, the term "above" may include "above" and "below". The device can also be positioned in other different ways (rotating 90 degrees or in other directions), and the spatial relative description used here is explained accordingly.

In addition, it should be noted that the use of words such as "first" and "second" for defining parts is only for the convenience of distinguishing corresponding parts. Unless otherwise stated, the above words have no special meanings, and cannot be understood as limiting the scope of protection of the present disclosure. In addition, although the terms used in the present disclosure are selected from well-known common terms, some of the terms mentioned in the specification of the present disclosure may be selected by the applicant based on his or her discretion, and their detailed meaning is explained in the relevant part of the description herein. In addition, the disclosure is understood not only by the actual terms used, but also by the meaning implied by each term.

It should be understood that when a component is referred to be "on another component," "connected to another component," "coupled to another component," or "contacting another component", the component may be directly on, connected to, or coupled to, or in contact with another component, or there may be an inserting component. In contrast, when a component is referred to be "directly on another component," "directly connected to," "directly coupled to," or "directly in contact with" another component, there is no inserting part. Similarly, when the first component is referred to be "in electrical contact with" or "electrically coupled to" the second component, there is a circuit path allowing current to flow between the first component and the second component. The circuit path may include capacitors, coupled inductors, and/or other components in which a current flow is allowed, even without direct contact between conductive components.

Flowcharts are used in the present disclosure to illustrate operations performed by a system according to an embodiment of the present disclosure. It should be understood that the preceding or following operations are not necessarily performed precisely in order. Instead, the various operations may be processed in reverse order or simultaneously. Also, other operations are added to or removed from the processes.

In the 3D memory device, multiple sub-array common sources penetrating through a stacked structure are first formed in a stacked structure, the adjacent sub-array common sources are separated by a separating structure formed in the stacked structure, and then a connection bridge for connecting the multiple sub-array common sources is formed on the separating structure. An insulating layer penetrating through gate layers and multiple layers of dielectric layers is disposed on the separating structure for separating the gate layer on top of the stacked structure. When the insulating layer is formed by a step such as deposition, a small depression is easily formed on an upper surface of the insulating layer. In a subsequent process, materials such as polysilicon silicon can easily fill or remain in the depression. The residual material is prone to generate hidden dangers, such as falling off in some processes and interfering with the current process.

Embodiments of the present disclosure describe a method for manufacturing a three-dimensional memory device. With the method, multiple sub-array common sources are formed in and penetrating through a stacked structure, and adjacent sub-array common sources are separated by a separating structure formed in the stacked structure. An insulating layer penetrating through gate layers and multiple layers of dielectric layers is disposed on the separating structure, for separating the gate layer on top of the stacked structure. The method can reduce the material residue of the insulating layer on the separating structure.

FIG. 1 is a flowchart of a method for manufacturing a three-dimensional memory device according to an embodiment of the present disclosure. FIGS. 2A-2D are schematic top views of a process for manufacturing a three-dimensional memory device in an embodiment of the present disclosure. FIGS. 3A-3G are schematic cross-sectional views in a Y direction in a process for manufacturing a three-dimensional memory device in an embodiment of the present disclosure. FIGS. 4A-4E are schematic cross-sectional views in an X direction in a process for manufacturing a three-dimensional memory device in an embodiment of the present disclosure. The method for manufacturing an embodiment of the present disclosure is described below with reference to FIGS. 1-4E.

At operation 101, a semiconductor structure is provided, including a substrate and a stacked structure on the substrate. The stacked structure includes gate layers and dielectric layers which are alternatively stacked.

Figure 2A:
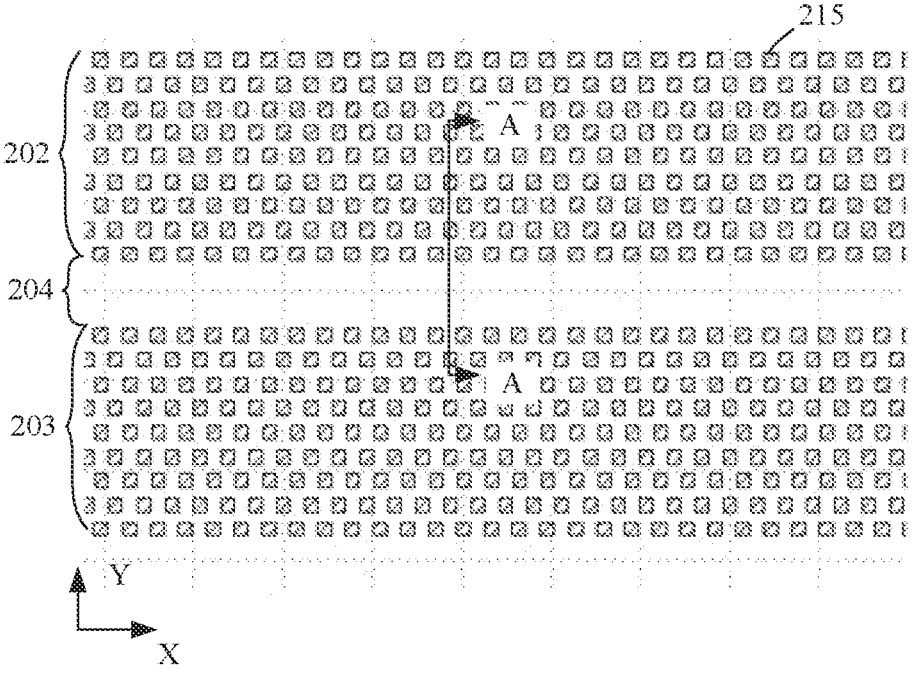
FIG. 2A is schematic top views of a process for manufacturing a three-dimensional memory device in an embodiment of the present disclosure.
Figure 3A:
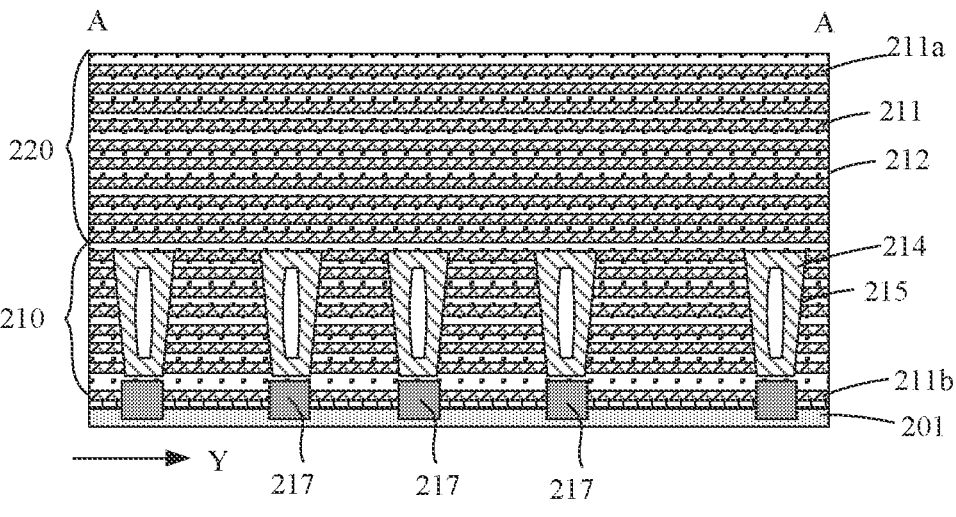
FIG. 3A is schematic cross-sectional views in the Y direction in a process for manufacturing a three-dimensional memory device in an embodiment of the present disclosure.

FIG. 3A is an A-A sectional view of FIG. 2A. Referring to FIGS. 2A and 3A, the semiconductor structure includes a substrate 201 and a stacked structure including a first stack 210 and a second stack 220 on the substrate. For simplicity, only the semiconductor structure for forming a core region of the three-dimensional memory device is shown. The core region is used to form a memory cell array. The stacked structure includes multiple dummy gate layers 211 and multiple dielectric layers 212, which are alternately stacked. The dummy gate layer 211 may include one or more top selective dummy gate layers 211*a* disposed at the top of the second stack 220, and may further include a bottom selective dummy gate layer 211*b* disposed at the bottom of the first stack 210.

The substrate 201 can be a silicon (Si) substrate, a germanium (Ge) substrate, silicon germanium (SiGe) substrate, silicon on insulator (SOI), germanium on insulator (GOI), or the like. In some embodiments, the substrate 201 may also include a substrate of other elementary semiconductors or compound semiconductors, such as GaAs, InP, or SiC. The substrate 201 may also be a laminated structure, such as Si/SiGe. Other epitaxial structures may also be included, such as silicon germanium on insulators (SGOI). In some embodiments, the substrate 201 may be made of a non-conductive material, such as glass, plastic, sapphire wafer, or the like.

The dummy gate layer 211 and the dielectric layer 212 may be selected from the following materials: silicon nitride, silicon oxide, amorphous carbon, diamond-like amorphous carbon, germanium oxide, aluminum oxide, and combinations thereof, and include at least one insulating medium. The dummy gate layer 211 and the dielectric layer 212 have different etch selectivity. The combination may be, for example, a combination of silicon nitride and silicon oxide, a combination of silicon oxide and undoped polysilicon or amorphous silicon, a combination of silicon oxide or silicon nitride and amorphous carbon, or the like. A deposition method of the dummy gate layer 211 and the insulating layer 212 may include chemical vapor deposition (CVD, PECVD, LPCVD, HDPCVD), atomic layer deposition (ALD), or a physical vapor deposition method such as molecular beam epitaxy (MBE), thermal oxidation, evaporation, sputtering and the like.

Various manufacturing techniques such as gate first manufacturing technique and gate last manufacturing technique may be used to manufacture a three-dimensional memory device. As shown in FIG. 3A, in the gate last manufacturing technique, the dummy gate layer is used to facilitate the formation of a channel structure of a memory cell, and is replaced with a gate of the memory cell after the formation of the channel structure. In order to replace the dummy gate layer with the gate, the dummy gate layer is removed first and then a gate layer is formed. In the gate first manufacturing technique, the gate of the memory cell is formed earlier than the channel structure of the memory cell. In the gate first manufacturing technique, the material of the gate layer can be a conductive material such as metallic tungsten, cobalt, copper, nickel, or can be polysilicon, doped silicon, or any combination thereof.

Continuing with reference to FIGS. 2A and 3A, a first channel hole 215 is previously formed in the bottom first stack 210 and filled with a sacrificial layer 214. A material of the sacrificial layer 214 can be polysilicon. As shown in FIG. 2A, an array of first channel hole 215 is divided to form multiple memory blocks (e.g., 202 and 203), and the memory blocks are separated by a gate line slit region 204.

Further, a conductive portion 217 is formed under the first channel hole 215. The conductive portion 217 is, for example, silicon formed by a Selective Epitaxial Growth process.

It is noted that although the example diagram of FIG. 3A shows a stacked structure including two stacks, more or fewer stacks than two stacks are also within the scope of implementation of the present disclosure. In other examples, a single stack can be used, and in this case, no structures such as the first channel hole 215, the sacrificial layer 214, and the conductive portion 217 are formed in advance in the stacked structure.

At operation 102, multiple grooves are formed at intervals in the gate line slit region of the stacked structure, which is flattened and not polished yet, and each groove penetrates through the gate layers and multiple layers of the dielectric layers.

Figure 2B:
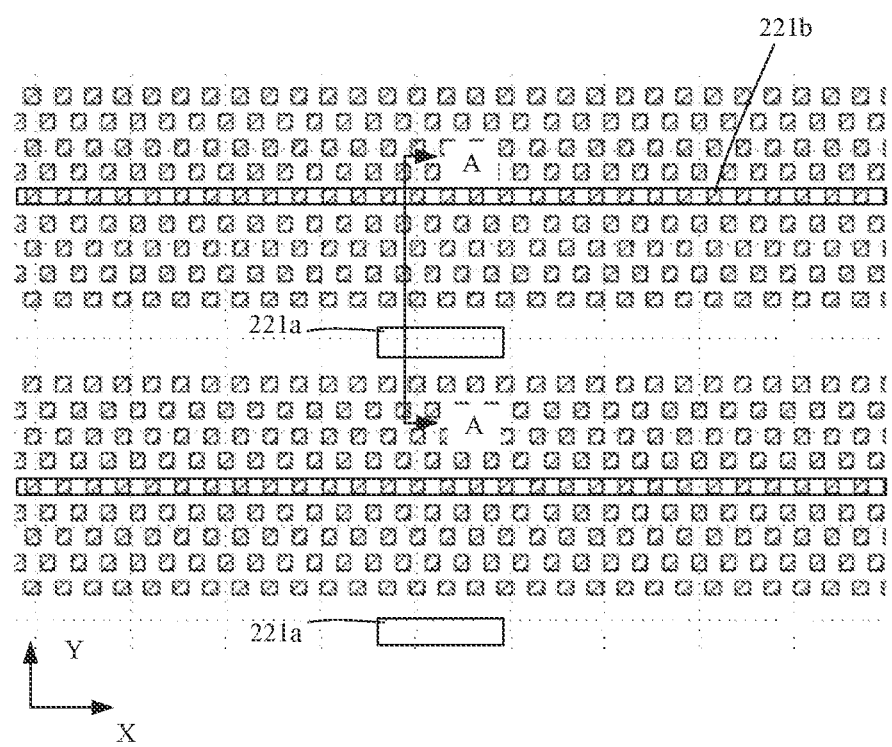
FIG. 2B is schematic top views of a process for manufacturing a three-dimensional memory device in an embodiment of the present disclosure.
Figure 3B:
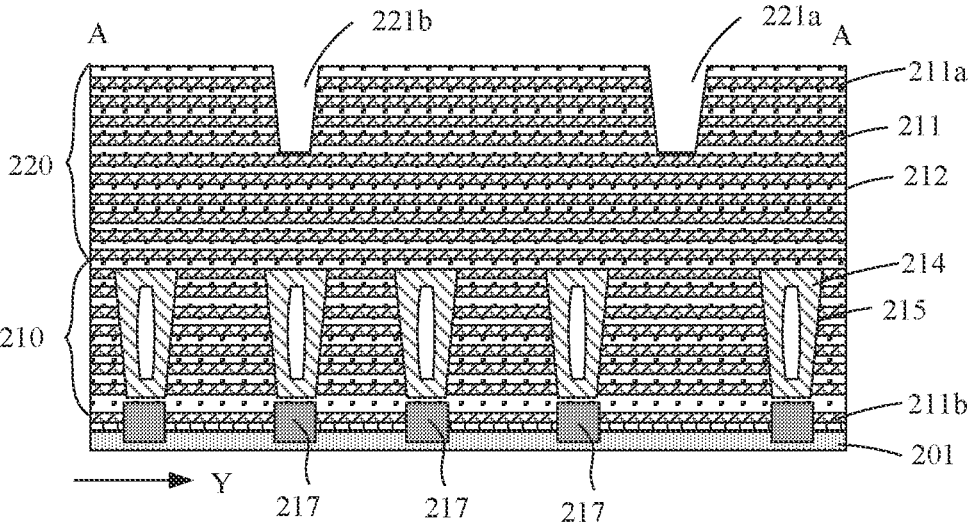
FIG. 3B is schematic cross-sectional views in the Y direction in a process for manufacturing a three-dimensional memory device in an embodiment of the present disclosure.

FIG. 3B is an A-A sectional view of FIG. 2B. Referring to FIGS. 2B and 3B, after the second stack 220 of the stacked structure is flattened and before the second stack is polished, multiple grooves 221*a* are formed at intervals in the gate line slit region 204. It should be appreciated that the grooves 221*a* are arranged in the core region of the three-dimensional memory device. The groove 221*a* penetrates through a stacked layer composed of the gate layers and multiple layers of the dielectric layers. There is still a stacked layer composed of multiple gate layers and multiple dielectric layers under the groove 221*a*.

In an embodiment, a top selective gate cut 221*b* extending in the X direction is also formed in the stacked structure in this operation. The top selective gate cut 221*b* is used to divide the memory block into multiple memory fingers. Each top selective gate cut 221*b* aligns with a row of first channel holes 215 below. Thus, the top selective gate cut 221*b* and the groove 221*a* are formed according to the same etching process. In this way, the groove 221*a* can be formed by the existing process, only a photomask pattern originally used to etch the top selective gate cut is changed without additional photomask and etching process. In an embodiment, the depth of the groove 221*a* is the same as the depth of the top selective gate cut 221*b*. In an embodiment, the width of the groove 221*a* in the Y direction is greater than the width of the top selective gate cut 221*b* in the Y direction.

The polishing here is typically Chemical Mechanical Polishing (CMP). Conventionally, the CMP operation is performed after flattening. The inventors of the present disclosure have found that removing the CMP operation herein can alleviate the problem of uneven layer thickness, further make the window width of the aforementioned etching (typically using dry etching) process larger, and make the etching staying depth more uniform.

At operation 103, the insulating layer is covered on a surface of the stacked structure and in the multiple grooves. A depression exists on a surface of the insulating layer on the grooves.

Compared with prior art, with the method for manufacturing a three-dimensional memory device according to the embodiment of the present disclosure, the insulating layer is polished after forming the insulating layer covering the groove of the gate line slit region, thereby avoiding the depression on the surface of the insulating layer, and the residue of the material in the subsequent process. Therefore, the method for manufacturing the three-dimensional memory device provided by the embodiment of the present disclosure can reduce the hidden danger such as the falling off of the residual material.

Figure 2C:
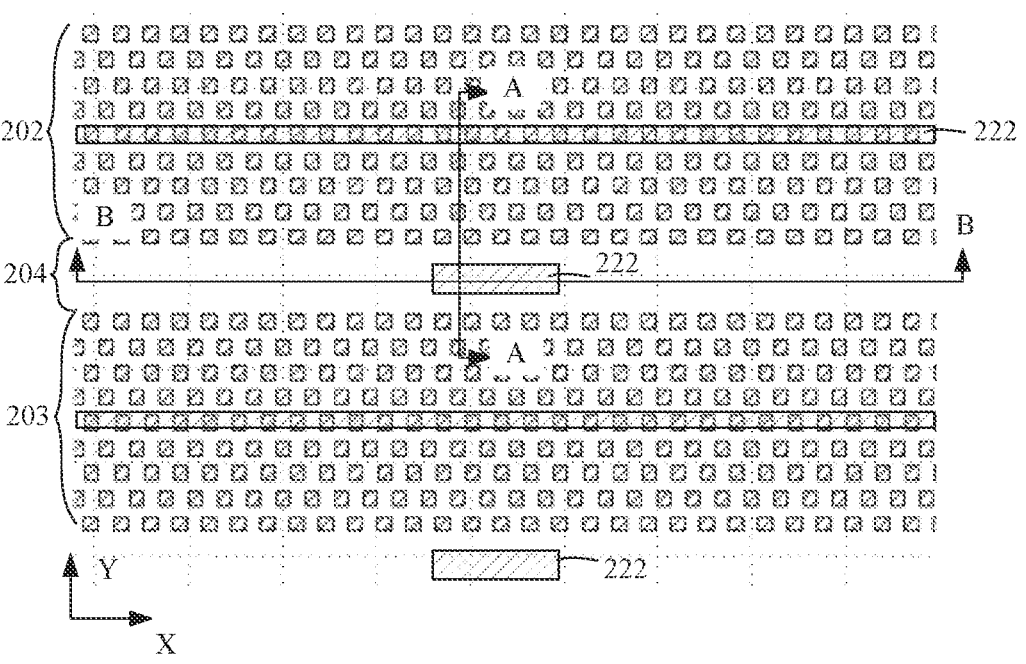
FIG. 2C is schematic top views of a process for manufacturing a three-dimensional memory device in an embodiment of the present disclosure.
Figure 3C:
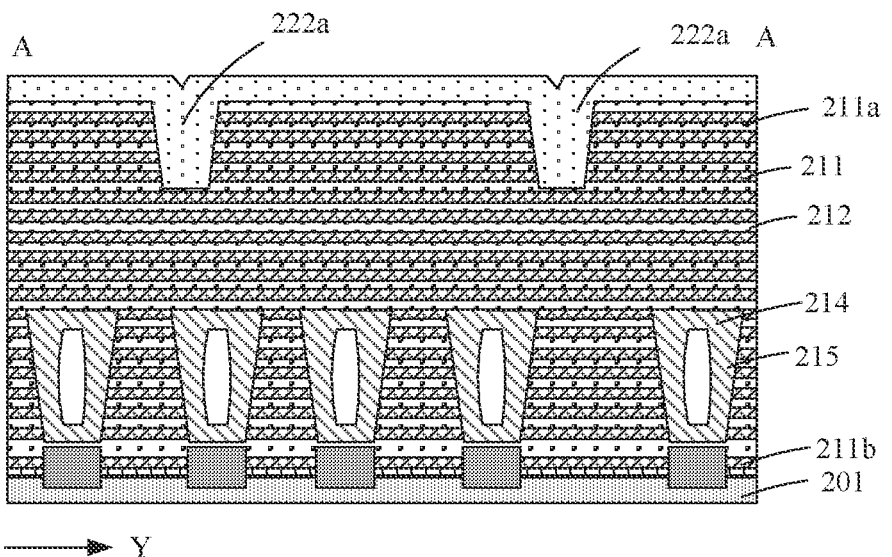
FIG. 3C is schematic cross-sectional views in the Y direction in a process for manufacturing a three-dimensional memory device in an embodiment of the present disclosure.
Figure 3D:
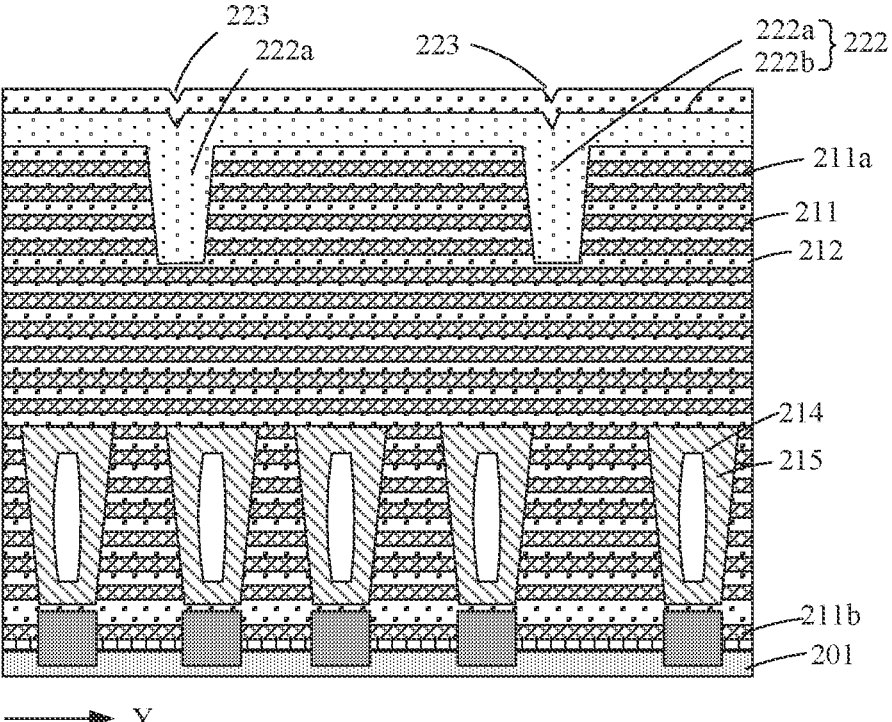
FIG. 3D is schematic cross-sectional views in the Y direction in a process for manufacturing a three-dimensional memory device in an embodiment of the present disclosure.

FIG. 3C is a cross-sectional view along A-A shown in FIG. 2C. As shown in FIGS. 2C and 3C, the first insulating layer 222a is covered on the surface of the stacked structure and in the multiple grooves 221a. The first insulating layer 222a may be formed using a furnace tube process. Next, as shown in FIG. 3D, the second insulating layer 222b is covered on the surface of the stacked structure and in the multiple grooves 221a. The second insulating layer 222b may be formed using a Physical Vapor Deposition process. The first insulating layer 222a and the second insulating layer 222b together constitute an insulating layer 222.

In the example where the top selective gate cut is formed, the first insulating layer 222a is also filled in the top selective gate cut 221b. The insulating layer in the top selective gate cut 221b and the insulating layer in the groove 221a are formed according to the same filling process.

In an embodiment, the thickness of the insulating layer 222 (including the first insulating layer and the second insulating layer) on the surface of the stacked structure ranges from 150 to 250 nm. A material of the insulating layer 222 is, for example, silicon oxide.

Referring to FIG. 3D, the stacked structure has a depression 223 on the surface of the insulating layer above the groove 221a and the top selective gate cut 221b.

At operation 104, the insulating layer is polished to flatten the depression.

Figure 3E:
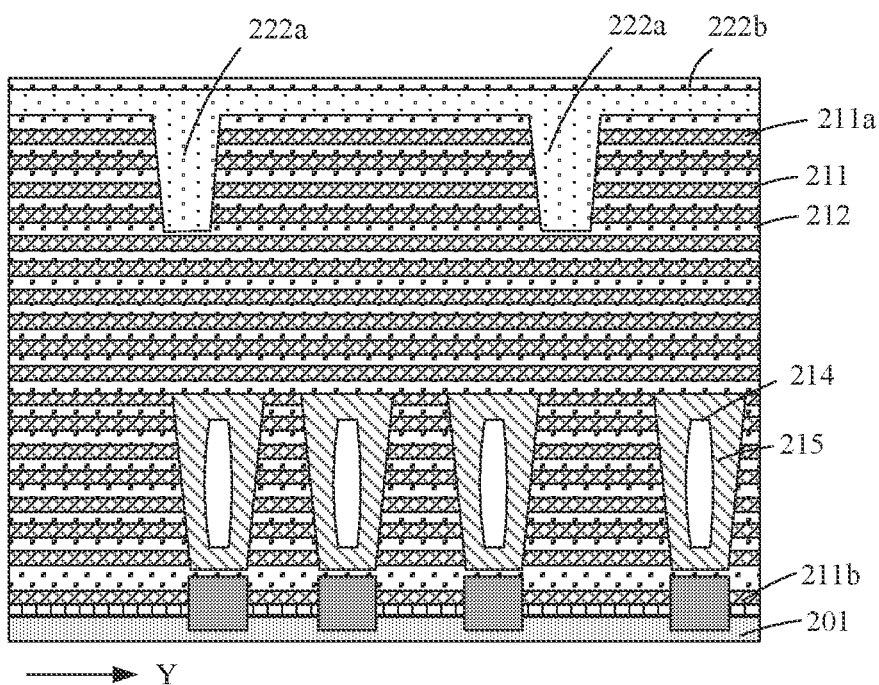
FIG. 3E is schematic cross-sectional views in the Y direction in a process for manufacturing a three-dimensional memory device in an embodiment of the present disclosure.
Figure 4A:
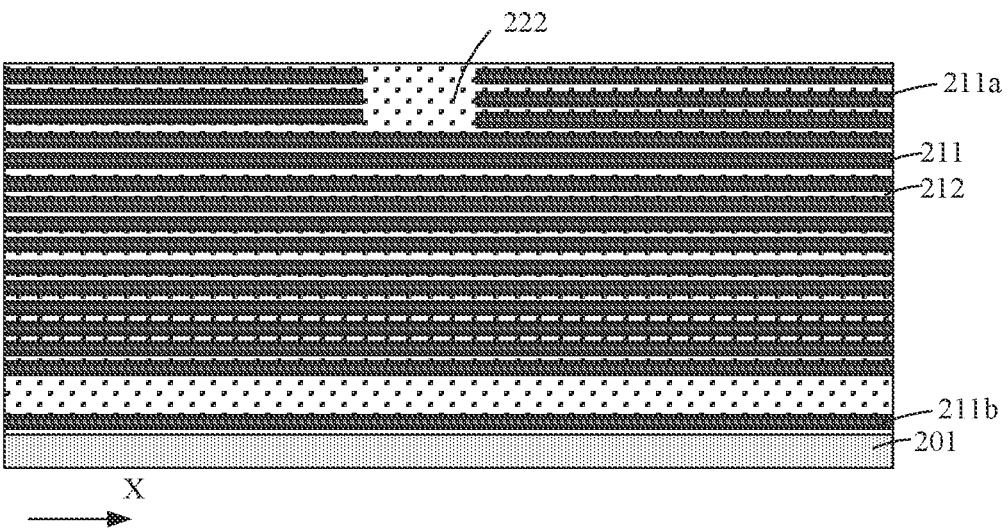
FIG. 4A is schematic cross-sectional views in the X direction in a process for manufacturing a three-dimensional memory device in an embodiment of the present disclosure.

FIG. 4A is a sectional view along B-B of FIG. 2C. Referring to FIG. 2C, FIG. 3E and FIG. 4A, the insulating layer is polished using the CMP process to flatten the depression 223 to obtain a flat insulating layer surface. In an embodiment, a polishing time is controlled to control the polishing thickness. For example, the polishing thickness can be set to 20 nm, and the polishing time can be set accordingly.

In contrast to conventional techniques, polishing after forming an insulating layer can eliminate the depression, thereby avoiding material residues in subsequent processes.

At operation 105, a channel structure array is formed in the core region of the stacked structure. The channel structure array is separated into multiple regions by the gate line slit region.

Figure 3F:
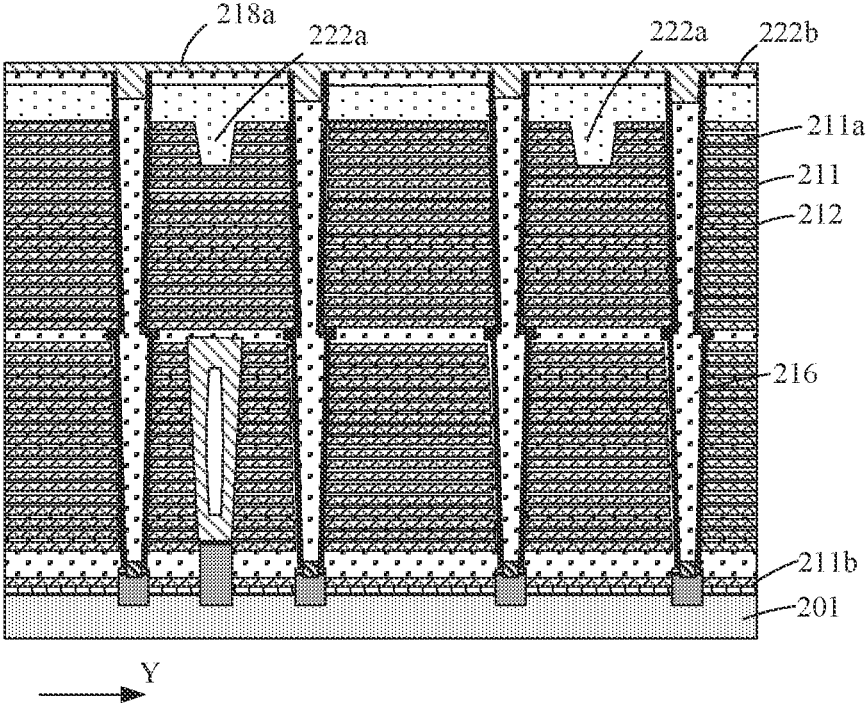
FIG. 3F is schematic cross-sectional views in the Y direction in a process for manufacturing a three-dimensional memory device in an embodiment of the present disclosure.

Referring to FIG. 3F, multiple channel structures 216 vertically penetrating through the stacked structure are formed. As a whole, in the channel structure, a memory layer and a channel layer are sequentially disposed from the outside to the inside along a radial direction of a channel hole. The memory layer may include a barrier layer, a charge trapping layer, and a tunneling layer sequentially disposed from outside to inside along the radial direction of the channel hole. The channel layer is provided with a filling layer inside. The filling layer can act as a support. A material of the filling layer can be silicon oxide. The filling layer can be solid or hollow without affecting the reliability of the device. The formation of the vertical channel structure can be implemented by one or more thin film deposition processes, such as ALD, CVD, physical vapor deposition (PVD), or any combination thereof.

At operation 106, a conductive plug is formed on the top of each channel structure of the channel structure array.

Figure 3G:
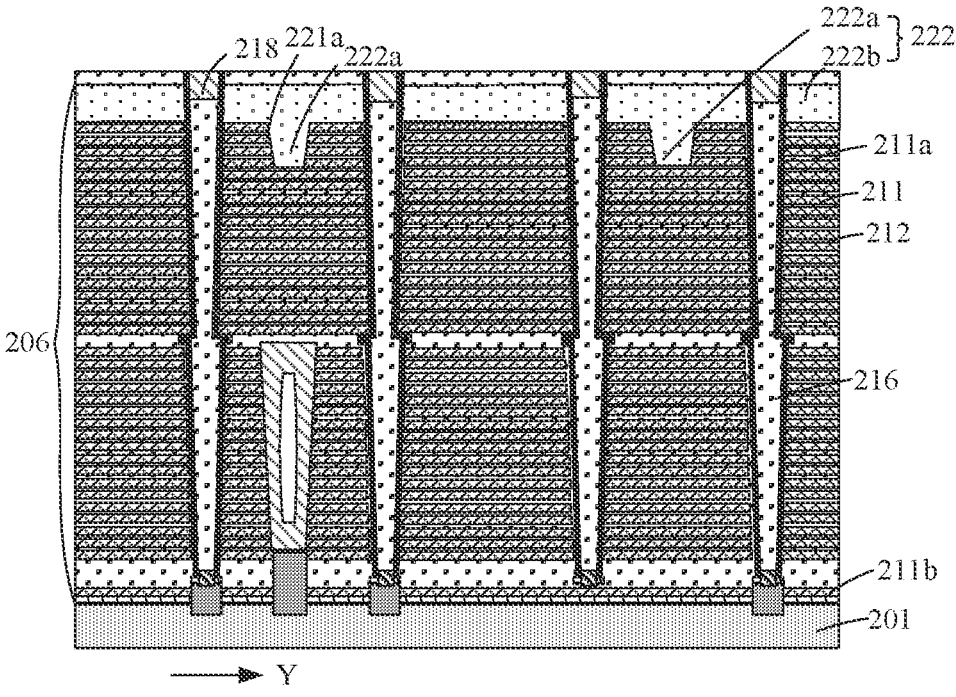
FIG. 3G is schematic cross-sectional views in the Y direction in a process for manufacturing a three-dimensional memory device in an embodiment of the present disclosure.

Referring to FIG. 3F, a portion of the material is removed on the top of each channel structure, and a conductive material 218a is covered. The conductive material 218a is, for example, polysilicon. Then, as shown in FIG. 3G, the conductive material on the surface of the stacked structure is removed, and the conductive material on the top of the channel structure is reserved as the conductive plug 218.

Here, since the insulating layer under the conductive material 218a is already flat, there is no residual conductive material left on the surface of the insulating layer, causing a hidden danger.

At operation 107, gate line slits are formed in the gate line slit region, and the gate line slits are separated by multiple grooves.

Figure 2D:
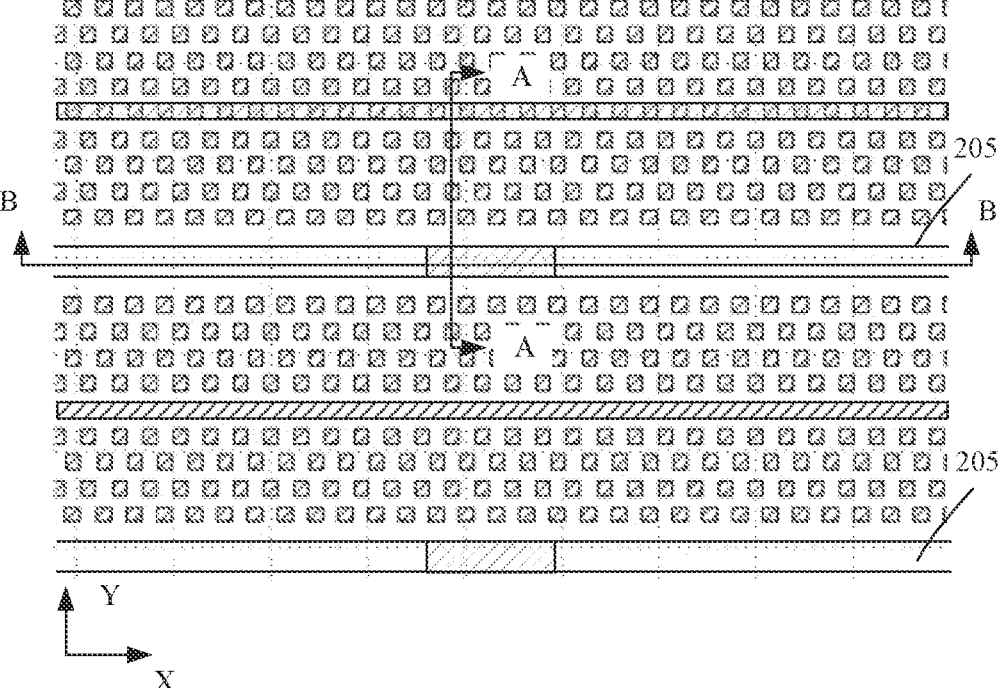
FIG. 2D is schematic top views of a process for manufacturing a three-dimensional memory device in an embodiment of the present disclosure.
Figure 4B:
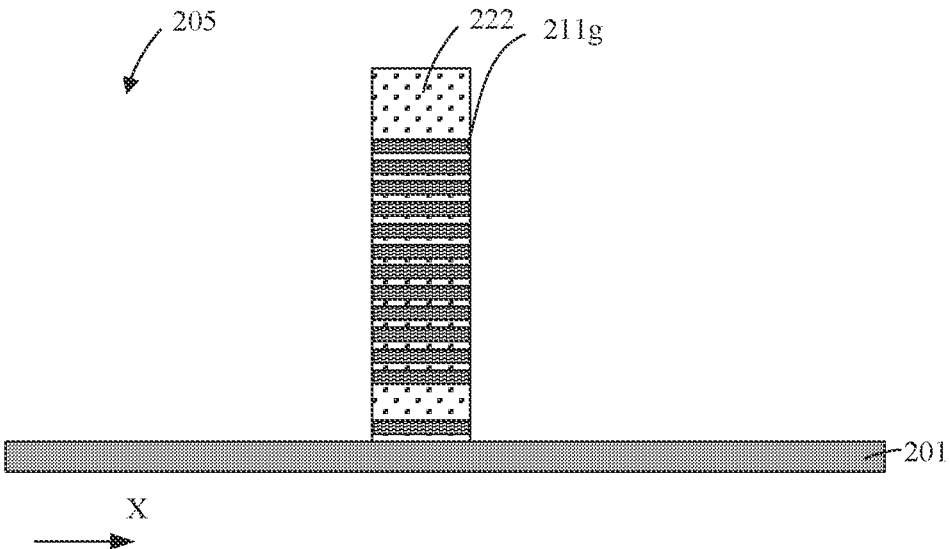
FIG. 4B is schematic cross-sectional views in the X direction in a process for manufacturing a three-dimensional memory device in an embodiment of the present disclosure.

FIG. 4B is a cross-sectional view along B-B of FIG. 2D. Referring to FIG. 2D and FIG. 4B, the gate line slit 205 is formed by perpendicularly etching in a region of the gate line slit region 204 in which there is no groove 221a and insulating layer 222. Here, the gate line slits 205 are separated by a separating structure composed of the insulating layer in the groove 221a and a stacked layer under the groove 221a.

Due to the supporting effect of the separating structure, the formation of the gate line slits 205 does not easily cause the collapse of the stacked structure, thereby improving the stability of the stacked structure.

Referring to FIG. 4B, in the gate last manufacturing technique, after the gate line slit 205 is formed, the dummy gate layer 211 in the stacked layer can be removed through the gate line slit 205 to form a gap, and the dummy gate layer 211 can be replaced with a gate layer 211g. A material of the gate layer 211g is, for example, metallic tungsten, cobalt, copper, nickel, or the like, and can be polysilicon, doped silicon, or any combination thereof.

At operation 108, a conductive material is filled in the gate line slits to form an array common source.

Figure 4C:
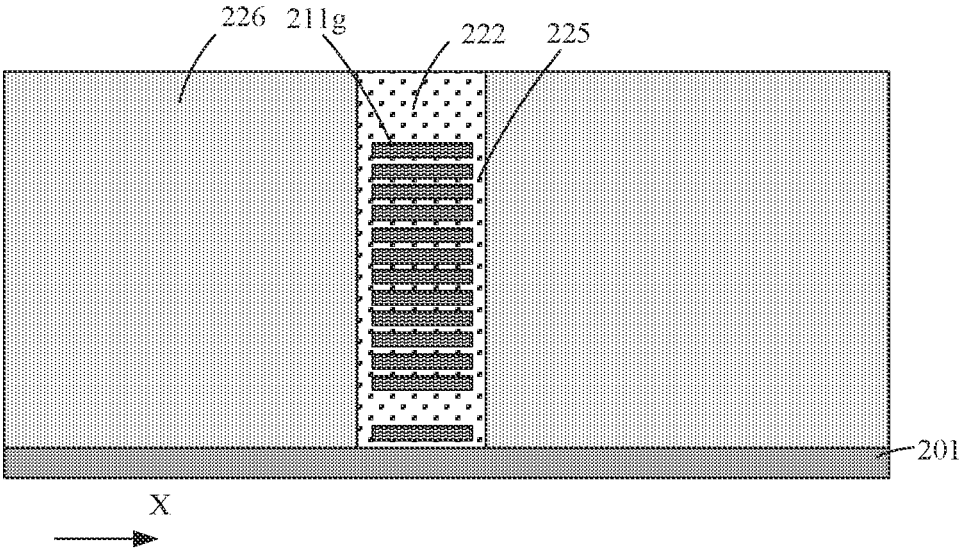
FIG. 4C is schematic cross-sectional views in the X direction in a process for manufacturing a three-dimensional memory device in an embodiment of the present disclosure.

Referring to FIG. 4C, the gate line slit 205 is first covered with a spacer 225 and then filled with a conductive material to form an array common source 226. In an embodiment, a material of the spacer 225 is silicon oxide, and the conductive material is, for example, polysilicon. The array common source 226 is still separated by a separating structure composed of the insulating layer in the groove 221a and the stacked layer below the groove 221a.

At operation 109, a connection bridge is formed across the insulating layer in each groove. The connection bridge makes the array common source spaced by the insulating layer communicate with each other.

Figure 4D:
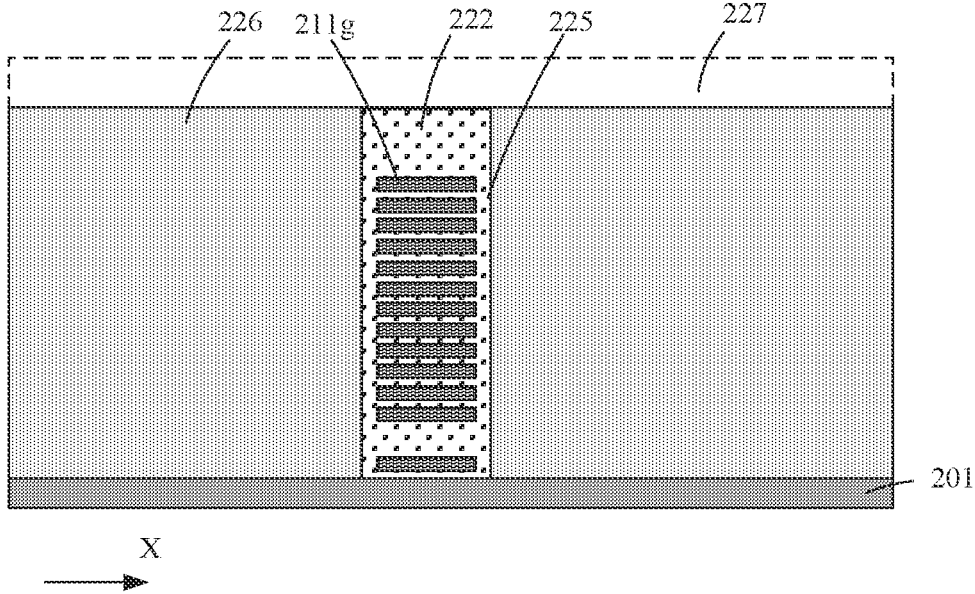
FIG. 4D is schematic cross-sectional views in the X direction in a process for manufacturing a three-dimensional memory device in an embodiment of the present disclosure.
Figure 4E:
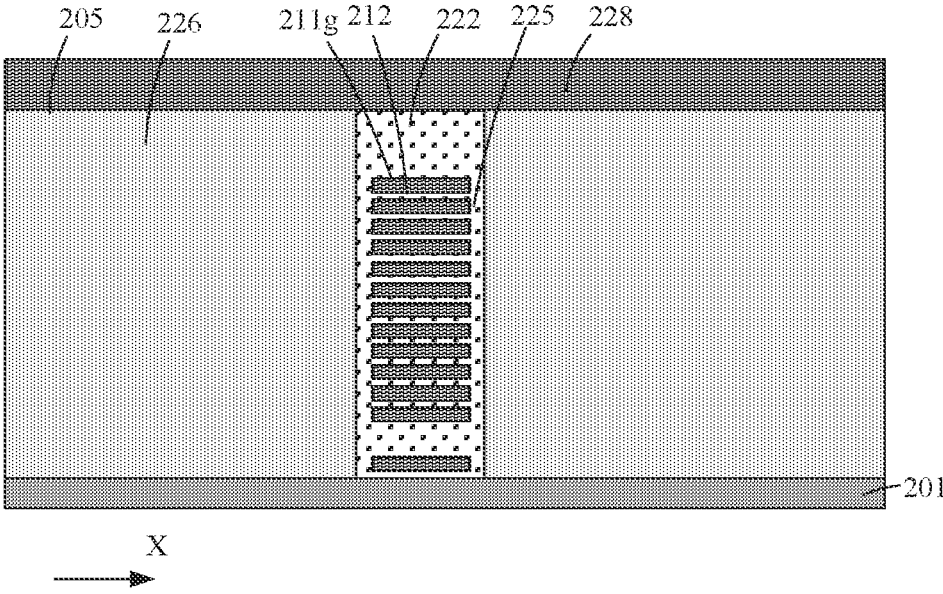
FIG. 4E is schematic cross-sectional views in the X direction in a process for manufacturing a three-dimensional memory device in an embodiment of the present disclosure.

Referring to FIG. 4D, an insulating layer 227 is covered on the surface of the semiconductor structure, and then the insulating layer on the gate line slit 205 is removed to form an opening. Subsequently, as shown in FIG. 4E, a conductive material is covered at the opening of the gate line slit 205 as a connection bridge 228. The conductive material is, for example, metallic tungsten, cobalt, copper, nickel, or the like.

Flowcharts are used herein to illustrate operations of the method according to an embodiment of the present disclosure. It should be understood that the preceding operations are not necessarily performed precisely in order. Instead, the various operations may be processed in reverse order or simultaneously. Also, other operations are added to the operations, or one or more operations are removed from the processes.

The three-dimensional memory device according to an embodiment of the present disclosure can be obtained by performing conventional operations after the above method. The structure of the three-dimensional memory device according to an embodiment of the present disclosure is described below with reference to FIGS. 3G and 4E. The three-dimensional memory device includes a substrate 201 and a stacked structure 206 on the substrate 201. The stacked structure 206 includes gate layers 211g and dielectric layers 212 which are alternately stacked. The gate line slits 205 penetrate through the stacked structure 206 until the substrate 201. The gate line slits 205 are separated by multiple spaced separating structures, each of which has an upper insulating layer 222 and alternately stacked gate layers 211g and dielectric layers 212 below the insulating layer 222. Each insulating layer 222 penetrates through the gate layers 211g and multiple layers of the dielectric layers 212. As previously described with reference to FIG. 3E, an upper surface of each insulating layer 222 is flat and has no small depression, and therefore does not contain impurity particles such as polysilicon.

Continuing with reference to FIG. 4E, the three-dimensional memory device further includes an array common source 226 disposed in each gate line slit 205. At each gate line slit, a connection bridge 228 is formed across each insulating layer 222 to make the array common source 226 spaced by the separating structure communicate with each other.

Referring to FIG. 3G, the three-dimensional memory device further includes a top selective gate cut 221b penetrating through the gate layers and multiple layers of the dielectric layers in the stacked structure. The insulating layer is filled in both the groove 221a and the top selective gate cut 221b. In an embodiment, the insulating layer in the top selective gate cut and the insulating layer on the separating structure are formed according to the same filling process, so as to save the process.

In the context of an embodiment of the present disclosure, the three-dimensional memory device can be a 3D flash memory device, such as a 3D NAND flash memory device. While the basic concepts have been described above, it is apparent to those skilled in the art that the aforementioned disclosure is merely an example and does not constitute a limitation of the present disclosure. Although not specifically described herein, various modifications, improvements, and amendments to the present disclosure may be made by those skilled in the art. Such modifications, improvements, and amendments are proposed in the present disclosure, so that such modifications, improvements, and amendments also fall within the spirit and scope of embodiments of the present disclosure.

Also, the present disclosure uses specific words to describe embodiments of the present disclosure. For example, "one embodiment," "an embodiment," and/or "some embodiments" mean a structure, characteristic, or feature associated with at least one embodiment of the present disclosure. Therefore, it should be emphasized and noted that "one embodiment," "an embodiment," or "an alternative embodiment" mentioned twice or more in different positions in this specification do not necessarily refer to the same embodiment. Further, certain features, structures, or characteristics in one or more embodiments of the present disclosure may be appropriately combined.

Likewise, it should be noted that, in order to simplify the presentation of the present disclosure and therefore facilitate understanding of one or more disclosed embodiments, various features are sometimes incorporated into one embodiment, one figure, or the description thereof in the foregoing description of embodiments of the present disclosure. However, this disclosure method does not mean that the subject of the disclosure requires more features than those mentioned in the claims. In practice, the features of the embodiments are less than all of the features of the individual embodiments disclosed above.

In some embodiments, a number describing the number of components and attributes is used, it should be understood that such number for the description of embodiments is expressed by the words "about", "approximate" or "generally" in some examples. Unless otherwise stated, the words "about", "approximate" or "generally" indicates that the number permits a change ranging from −20% to +20%, unless otherwise noted. Accordingly, in some embodiments, a numerical parameter used in the specification and the claims is an approximation that may vary according to the features required by the individual embodiments. In some embodiments, the numerical parameter should take into account the specified significant digit and employ a general digit reservation method. Although in some embodiments of the present disclosure, a numerical field and parameter used to confirm the breadth of a range is an approximate value, the setting of such value is as precise as possible within a feasible range in a specific embodiment.

While the present disclosure has been described with reference to the present specific embodiments, those skilled in the art will recognize that the above embodiments are merely intended to illustrate the present disclosure, and various equivalent changes or replacements may be made without departing from the spirit of the present disclosure, so long as changes or variations of the above embodiments within the spirit of the present disclosure fall within the scope of the claims of the present disclosure.

The invention claimed is:

1. A three-dimensional memory device, comprising:
   a substrate;
   a stacked structure arranged on the substrate and comprising gate layers and dielectric layers, wherein the gate layers and the dielectric layers are alternately stacked;
   gate line slits penetrating through the stacked structure to the substrate, wherein the gate line slits are separated by a separating structure;
   an insulating layer disposed on the separating structure and extending outward from the separating structure to cover the stacked structure, wherein a surface of the insulating layer on the separating structure and a surface of the insulating layer on the stacked structure, deviating away from the substrate, are flat; and
   a top selective gate cut extending in a first lateral direction and arranged over and aligned with a row of channel holes filled with a sacrificial layer.

2. The three-dimensional memory device of claim 1, wherein the insulating layer comprises a first insulating layer on the separating structure and a second insulating layer on the first insulating layer, wherein a surface of the second insulating layer deviating away from the first insulating layer is flat.

3. The three-dimensional memory device of claim 1, further comprising an array common source disposed in the gate line slits.

4. The three-dimensional memory device of claim 3, further comprising a connection bridge across the insulating layer, wherein the connection bridge connects the array common source spaced by the insulating layer.

5. The three-dimensional memory device of claim 1, wherein the insulating layer is disposed in a core region of the stacked structure.

6. The three-dimensional memory device of claim 1, wherein the top selective gate cut extends through the gate layers and multiple layers of the dielectric layers in the stacked structure; and the top selective gate cut comprises another insulating layer, wherein the other insulating layer in the top selective gate cut and the insulating layer on the separating structure are formed according to a same filling process.

7. The three-dimensional memory device of claim 6, wherein a material of the other insulating layer in the top selective gate cut and a material of the insulating layer in the separating structure are identical.

8. The three-dimensional memory device of claim 7, wherein the identical material is silicon oxide.

9. The three-dimensional memory device of claim 6, wherein in a second lateral direction perpendicular to the first lateral direction, a width of the separating structure is greater than a width of the top selective gate cut.

10. The three-dimensional memory device of claim 1, wherein in a vertical direction where the gate layers and the dielectric layers are alternately stacked, a thickness of the insulating layer on the separating structure is approximately between 150 nm and 250 nm.

11. The three-dimensional memory device of claim 1, further comprising:

channel structures in a core region of the stacked structure, wherein the separating structure is disposed between the channel structures in a second lateral direction perpendicular to the first lateral direction, and one of the gate line slits is configured to extend, in the first lateral direction and a vertical direction that is perpendicular to the first and second lateral directions, between the channel structures.

12. The three-dimensional memory device of claim 11, wherein a conductive plug is arranged on top of each channel structure of the channel structures.

13. The three-dimensional memory device of claim 12, wherein a top surface of the conductive plug is flush with the surface of the insulating layer on the stacked structure.

14. The three-dimensional memory device of claim 12, wherein:

the insulating layer comprises a first insulating layer in the separating structure and a second insulating layer on the first insulating layer; and a top surface of the conductive plug is higher than a top surface of the first insulating layer.

15. The three-dimensional memory device of claim 11, wherein the insulating layer is arranged between adjacent ones of the channel structures.

16. The three-dimensional memory device of claim 1, wherein:

the insulating layer of the separating structure comprises a first insulating layer and a second insulating layer; and the three-dimensional memory device further comprises the top selective gate cut filled with the first insulating layer, the second insulating layer being disposed on the first insulating layer of the top selective gate cut.

17. The three-dimensional memory device of claim 1, further comprising:

a connection bridge disposed over the insulating layer of the separating structure and extending in the first lateral direction.

18. The three-dimensional memory device of claim 17, wherein the connection bridge is configured to electrically connect an array common source arranged at opposite sides of the insulating layer of the separating structure in the first lateral direction.

19. The three-dimensional memory device of claim 18, wherein a spacer is arranged on sidewalls of the separating structure, in a vertical direction perpendicular to the first lateral direction, between the array common source arranged at the opposite sides in the first lateral direction.

20. A three-dimensional memory device, comprising:

a substrate;

a stacked structure arranged on the substrate and comprising gate layers and dielectric layers, wherein the gate layers and the dielectric layers are alternately stacked;

gate line slits penetrating through the stacked structure to the substrate, wherein the gate line slits are separated by a separating structure;

an insulating layer disposed on the separating structure and extending outward from the separating structure to cover the stacked structure, wherein a surface of the insulating layer on the separating structure and a surface of the insulating layer on the stacked structure, deviating away from the substrate, are flat; and a connection bridge disposed over the insulating layer of the separating structure and extending in a first lateral direction, wherein:

the connection bridge is configured to electrically connect an array common source arranged at opposite sides of the insulating layer of the separating structure in the first lateral direction; and a spacer is arranged on sidewalls of the separating structure, in a vertical direction perpendicular to the first lateral direction, between the array common source arranged at the opposite sides in the first lateral direction.

* * * * *